(12) United States Patent
Chen et al.

(10) Patent No.: US 10,590,987 B2
(45) Date of Patent: Mar. 17, 2020

(54) SUPPORTING DEVICE FOR RAIL MEMBER

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

(*) Notice: Subject to any disclaimer, the term of this patent is extended or adjusted under 35 U.S.C. 154(b) by 0 days.

(21) Appl. No.: 16/131,006

(22) Filed: Sep. 13, 2018

(65) Prior Publication Data
US 2019/0010980 A1 Jan. 10, 2019

Related U.S. Application Data

(63) Continuation of application No. 15/264,617, filed on Sep. 14, 2016.

(30) Foreign Application Priority Data

Jun. 16, 2016 (TW) .............................. 105119025 A

(51) Int. Cl.
*A47B 88/40* (2017.01)
*F16C 29/00* (2006.01)
(Continued)

(52) U.S. Cl.
CPC ............ *F16C 29/004* (2013.01); *A47B 88/40* (2017.01); *A47B 88/43* (2017.01); *H05K 7/1489* (2013.01); *F16C 2314/72* (2013.01)

(58) Field of Classification Search
CPC ......... A47B 88/04; A47B 88/40; A47B 88/43; F16C 29/004; F16C 29/005; H05K 7/1489
(Continued)

(56) References Cited

U.S. PATENT DOCUMENTS 1,231,291 A    6/1917  Otte
1,301,495 A *  4/1919  Otte ....................... A47B 88/57
                                                   384/21
(Continued)

FOREIGN PATENT DOCUMENTS

AT          159675      10/1940
GB          105990       5/1917
(Continued)

*Primary Examiner* — James O Hansen
(74) *Attorney, Agent, or Firm* — Winston Hsu

(57) ABSTRACT

A supporting device for a rail member includes a first supporting frame and a second supporting frame. The first supporting frame has a first supporting means including a first supporting part and a second supporting part. A supporting passage is defined by the first supporting part and the second supporting part. The second supporting frame has a second supporting means including a third supporting part and a fourth supporting part. The first supporting means and the second supporting means are configured to support each other. A rail member is configured to be connected to one of the first supporting frame and the second supporting frame, the first supporting part is configured to support the third supporting part, and the second supporting part is configured to support the fourth supporting part. The first supporting part is spaced from and not directly connected to the second supporting part.

7 Claims, 16 Drawing Sheets

(51) Int. Cl.
*H05K 7/14* (2006.01)
*A47B 88/43* (2017.01)

(58) Field of Classification Search
USPC .......... 312/330.1, 334.1, 334.4, 334.7, 334.8
See application file for complete search history.

(56) References Cited

U.S. PATENT DOCUMENTS

| | | | |
|---|---|---|---|
| 2,277,703 | A | 3/1942 | Kennedy |
| 2,698,214 | A | 12/1954 | Skamser |
| 3,059,986 | A | 10/1962 | Miller, Jr. |
| 3,289,044 | A | 11/1966 | Ginsberg |
| 4,047,767 | A | 9/1977 | Foust |
| 4,944,605 | A | 7/1990 | Shen |
| 4,955,160 | A | 9/1990 | Röck |
| 5,624,171 | A * | 4/1997 | Soja .................. A47B 88/427 312/334.44 |
| 5,634,701 | A | 6/1997 | Hendrich |
| 6,834,923 | B2 | 12/2004 | Young |
| 6,848,760 | B2 | 2/2005 | Thomas |
| 7,740,330 | B2 | 6/2010 | Huang |
| 7,744,176 | B2 | 6/2010 | Milligan |
| 8,028,965 | B2 | 10/2011 | Chen |
| 8,328,300 | B2 * | 12/2012 | Yu ..................... A47B 88/43 312/333 |
| 8,371,667 | B2 | 2/2013 | Yu |
| 8,894,166 | B2 | 11/2014 | Laible |
| 9,328,769 | B1 * | 5/2016 | Chen ................. H05K 7/1489 |
| 9,545,153 | B2 | 1/2017 | Chen |
| 2001/0040142 | A1 * | 11/2001 | Haney ............... H05K 7/1421 211/183 |
| 2006/0152115 | A1 * | 7/2006 | Dubon ............... H05K 7/1489 312/334.8 |
| 2008/0036347 | A1 * | 2/2008 | Liang ................ H05K 7/1489 312/334.5 |
| 2009/0283652 | A1 | 11/2009 | Chen |
| 2011/0091141 | A1 | 4/2011 | Liang |
| 2014/0265788 | A1 | 9/2014 | Judge |
| 2014/0363109 | A1 | 12/2014 | Chen |

FOREIGN PATENT DOCUMENTS

| | | |
|---|---|---|
| JP | S48-4679 | 2/1973 |
| JP | S62-262847 A | 11/1987 |
| JP | H01-188870 A | 7/1989 |
| JP | 2006-46360 A | 2/2006 |
| JP | 3152281 U | 7/2009 |
| JP | 2010-183515 A | 8/2010 |
| JP | 2011-106660 A | 6/2011 |
| JP | 2011-257628 A | 12/2011 |
| JP | 3200963 U | 11/2015 |

* cited by examiner

SUPPORTING DEVICE FOR RAIL MEMBER

CROSS REFERENCE TO RELATED APPLICATIONS

This application is a continuation application of U.S. application Ser. No. 15/264,617, filed on Sep. 14, 2016. This application claims the benefit of U.S. application Ser. No. 15/264,617, which was filed on Sep. 14, 2016, and is incorporated herein by reference.

BACKGROUND OF THE INVENTION

1. Field of the Invention

The present invention relates to a supporting device for a rail member, and more particularly, to a supporting device capable of improving supporting capability of a rail member.

2. Description of the Prior Art

U.S. Pat. No. 8,028,965 B2 of Chen et al. discloses an adjustable bracket for a slide assembly. The case is provided for reference.

Since a server supported by a server slide rail is getting heavier, it is important to improve supporting capability of a rail member. Therefore, the present invention is provided accordingly.

SUMMARY OF THE INVENTION

The present invention relates to a supporting device for a rail member, which is capable of improving supporting capability of the rail member.

According to an embodiment of the present invention, a supporting device for a rail member comprises a first supporting frame and a second supporting frame. The first supporting frame has a first supporting means comprising a first supporting part and a second supporting part. A supporting passage is defined by the first supporting part and the second supporting part. The second supporting frame has a second supporting means comprising a third supporting part and a fourth supporting part. The first supporting means and the second supporting means are configured to support each other. A rail member is configured to be connected to one of the first supporting frame and the second supporting frame. The first supporting part of the first supporting frame is configured to support the third supporting part of the second supporting frame, and the second supporting part of the first supporting frame is configured to support the fourth supporting part of the second supporting frame. The first supporting part is spaced from and not directly connected to the second supporting part.

Preferably, the first supporting frame further comprises a first upper wall extendedly connected to the first supporting part and a first lower wall extendedly connected to the second supporting part. The second supporting frame further comprises a second side wall extendedly connected to the third supporting part and the fourth supporting part. The first upper wall and the first lower wall of the first supporting frame are configured to support the second side wall of the second supporting frame.

Preferably, the second supporting frame further comprises a second side wall extendedly connected to the third supporting part and the fourth supporting part. The first supporting part of the first supporting frame is configured to support the third supporting part and the second side wall of the second supporting frame. The second supporting part of the first supporting frame is configured to support the fourth supporting part and the second side wall of the second supporting frame. The first supporting frame further comprises a fifth supporting part extended from the first supporting part of the first supporting frame and located outside the supporting passage of the first supporting frame for supporting the third supporting part of the second supporting frame, and a sixth supporting part extended from the second supporting part of the first supporting frame and located outside the supporting passage of the first supporting frame for supporting the fourth supporting part of the second supporting frame.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
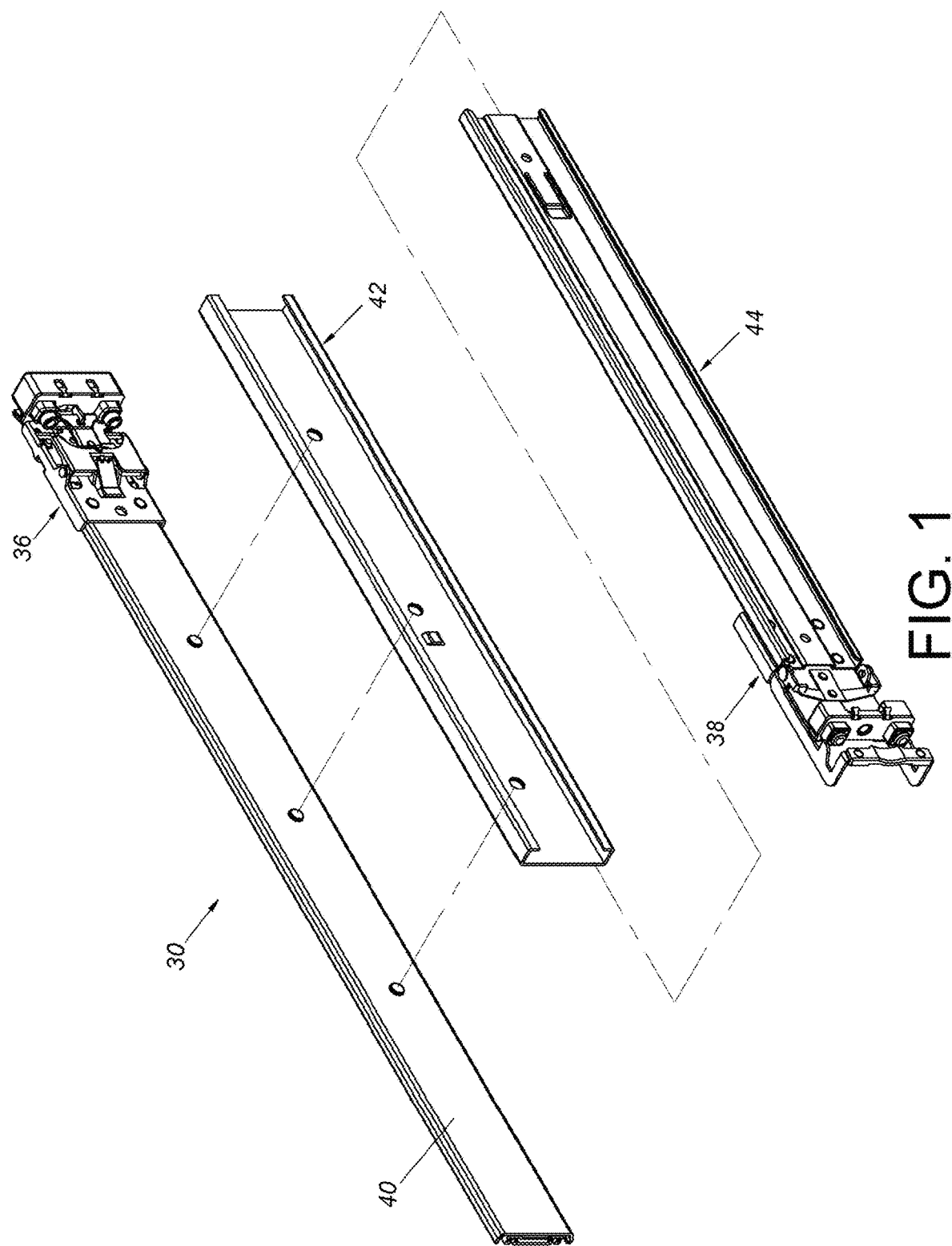
FIG. 1 is an exploded view of a slide rail assembly according to an embodiment of the present invention.
Figure 2:
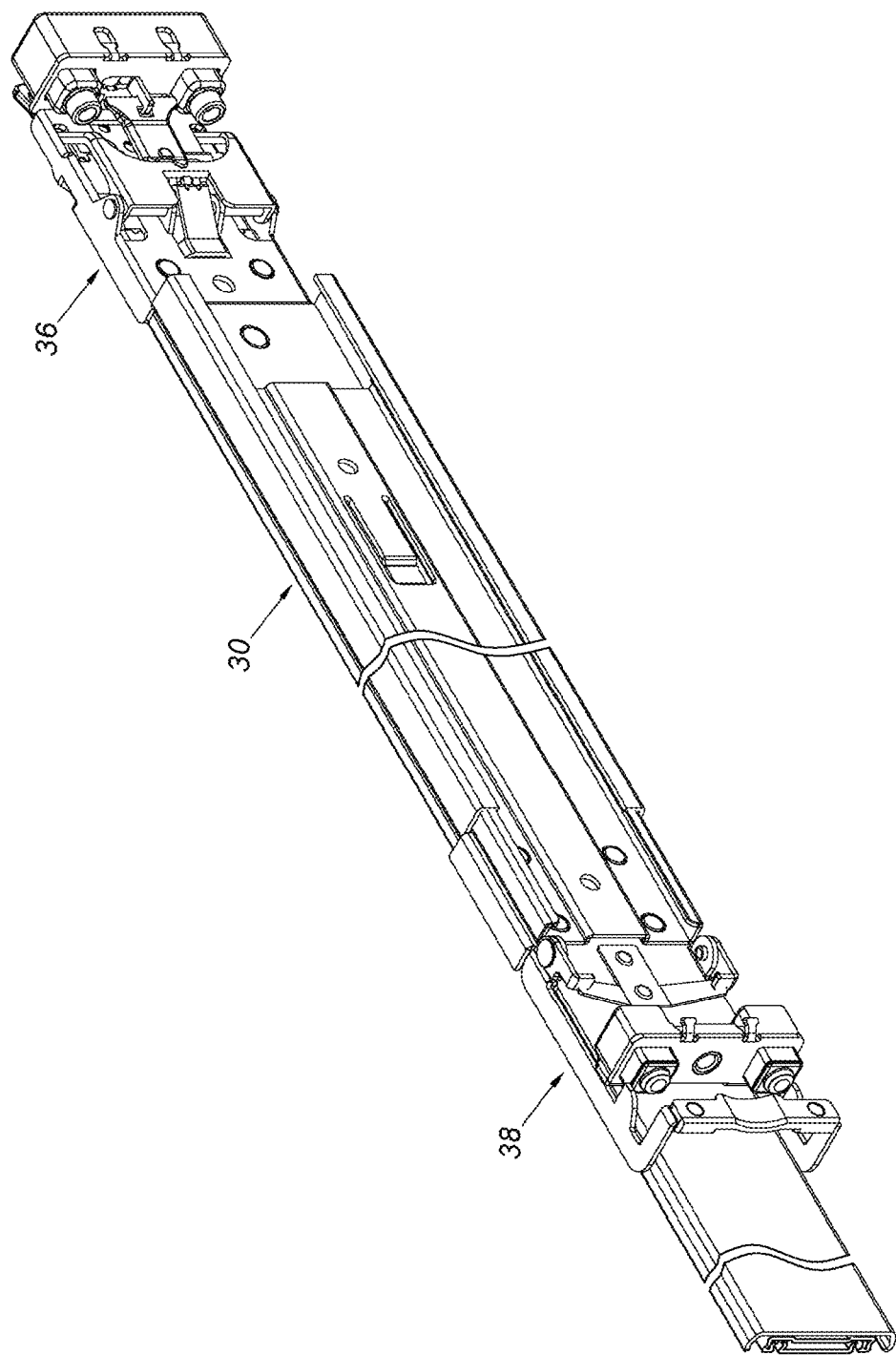
FIG. 2 is a diagram showing the slide rail assembly according to an embodiment of the present invention.
Figure 3:
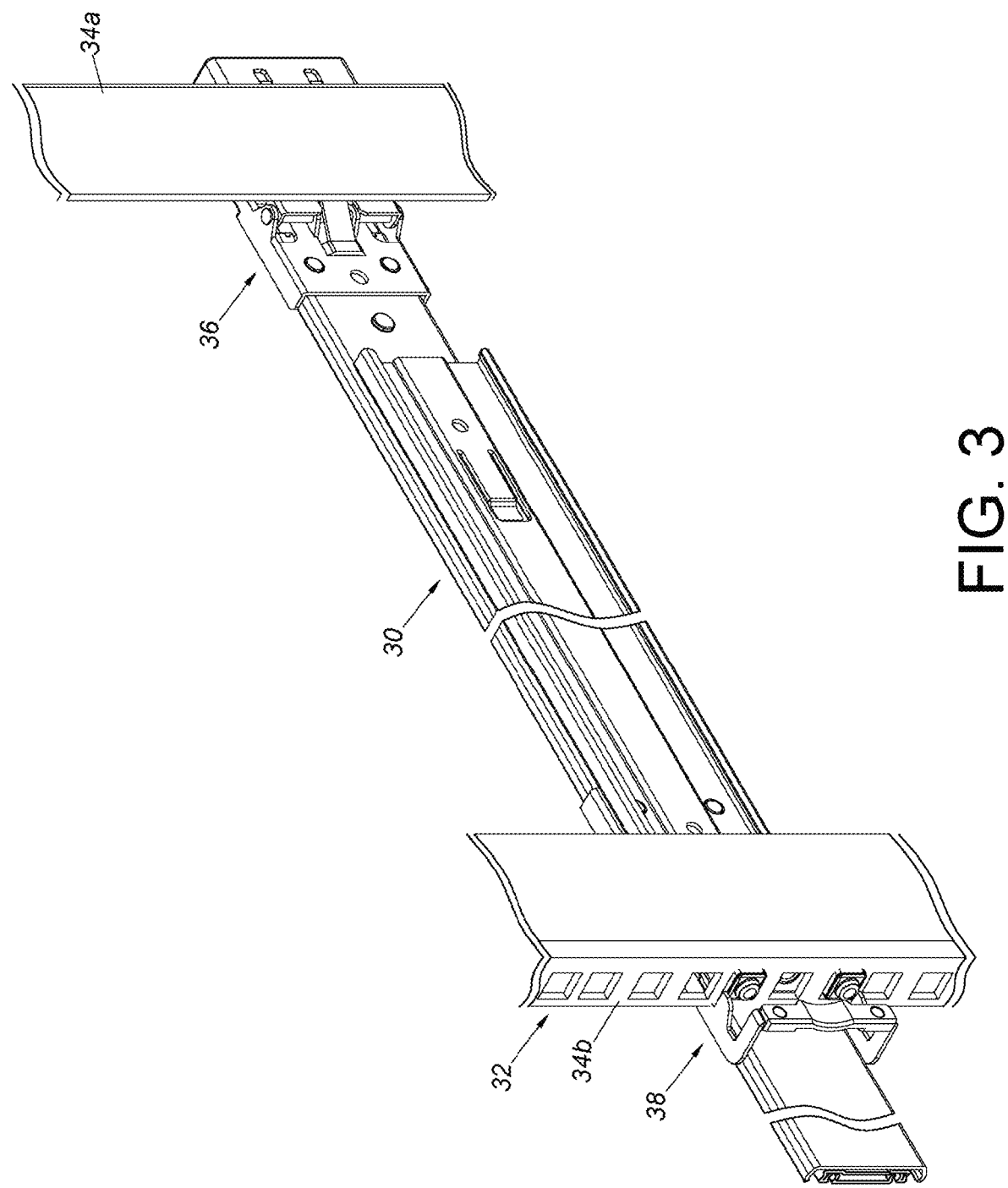
FIG. 3 is a diagram showing the slide rail assembly being mounted to a rack according to an embodiment of the present invention.

FIG. 1 to FIG. 3 are diagrams showing a slide rail assembly 30 configured to be mounted to a rack 32 according to an embodiment of the present invention. The rack 32 comprises a first post 34a and a second post 34b. The slide rail assembly 30 is mounted to the first post 34a of the rack 32 through a first bracket 36 and mounted to the second post 34b through a second bracket 38. Wherein, the slide rail assembly 30 comprises a rail member 40 and a supporting device. The supporting device comprises a first supporting frame 42 and a second supporting frame 44. The first supporting frame 42 is connected (such as fixedly connected) to the rail member 40.

Figure 4:
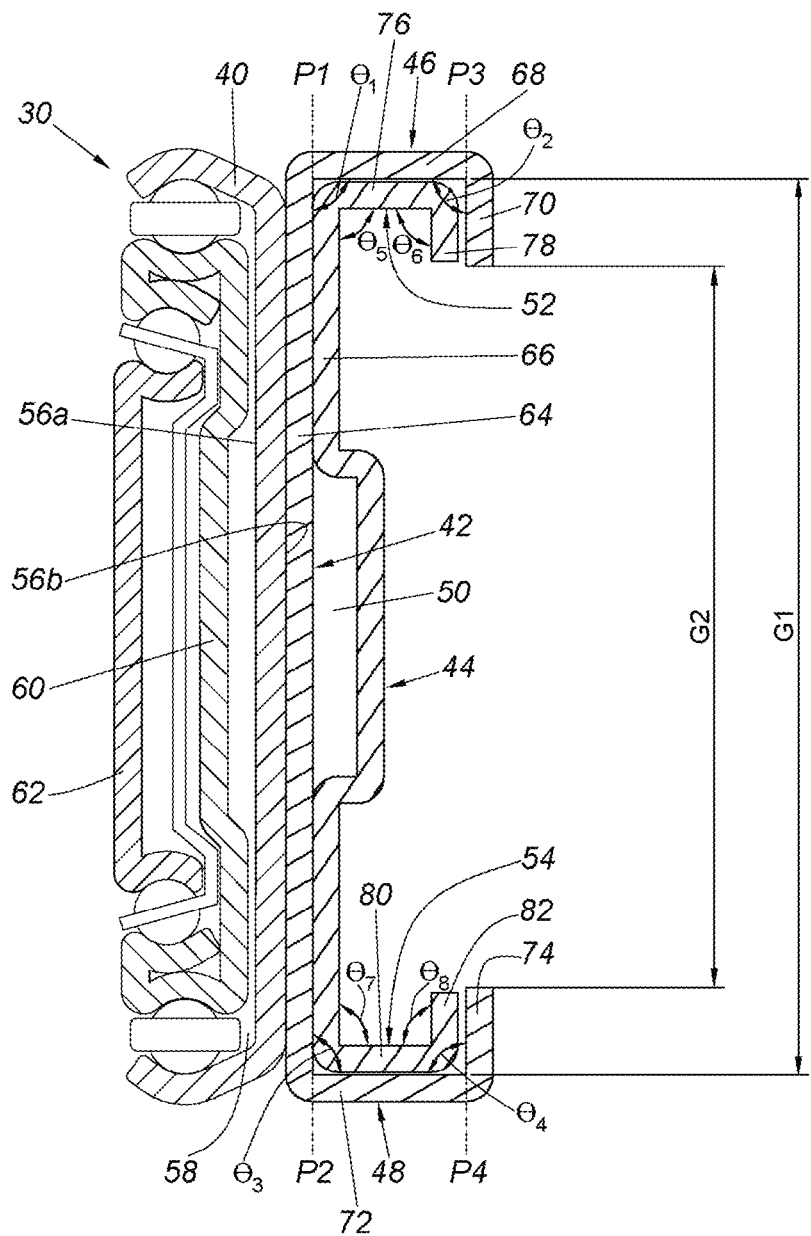
FIG. 4 is a cross-sectional view of the slide rail assembly according to a first embodiment of the present invention.

FIG. 4 is a cross-sectional view of the slide rail assembly 30 according to a first embodiment of the present invention. The first supporting frame 42 has a first supporting means comprising a first supporting part 46 and a second supporting part 48. A supporting passage 50 is defined by the first supporting part 46 and the second supporting part 48. Wherein, a first gap G1 is defined between a first supporting position P1 on the first supporting part 46 and a second supporting position P2 on the second supporting part 48, and a second gap G2 is defined between a third supporting position P3 on the first supporting part 46 and a fourth supporting position P4 on the second supporting part 48. The second gap G2 is different from the first gap G1. Through such arrangement, the first supporting frame 42 and the second supporting frame 44 can firmly support each other, and the second supporting frame 44 cannot be detached from the first supporting frame 42 through the second gap G2.

The second supporting frame 44 has a second supporting means comprising a third supporting part 52 and a fourth supporting part 54. Wherein, the first supporting part 46 of the first supporting frame 42 is configured to support the third supporting part 52 of the second supporting frame 44, and the second supporting part 48 of the first supporting frame 42 is configured to support the fourth supporting part 54 of the second supporting frame 48.

In a preferred embodiment, the rail member 40 has a first side 56a and a second side 56b. The first side 56a of the rail member 40 is formed with a slide rail passage 58. The first supporting frame 42 is connected to the second side 56b of the rail member 40. The slide rail assembly 30 further comprises a first rail 60 slidable within the slide rail passage 58 of the rail member 40, and a second rail 62 slidably connected to the first rail 60.

In a preferred embodiment, the first supporting frame 42 further comprises a first side wall 64 extendedly connected to the first supporting part 46 and the second supporting part 48. The second supporting frame 44 further comprises a second side wall 66 extendedly connected to the third supporting part 52 and the fourth supporting part 54. The first side wall 64 of the first supporting frame 42 is configured to support the second side wall 66 of the second supporting frame 44.

In a preferred embodiment, the first supporting part 46 of the first supporting frame 42 has a first portion 68 and a second portion 70. The first portion 68 is extended from a first end of the first side wall 64 to forma first angle θ1 therebetween. The second portion 70 is extended from the first portion 68 to form a second angle θ2 therebetween. The second supporting part 48 of the first supporting frame 42 has a third portion 72 and a fourth portion 74. The third portion 72 is extended from a second end of the first side wall 64 to form a third angle θ3 therebetween. The fourth portion 74 is extended from the third portion 72 to form a fourth angle θ4 therebetween. The third supporting part 52 of the second supporting frame 44 has a fifth portion 76 and a sixth portion 78. The fifth portion 76 is extended from a first end of the second side wall 66 to forma fifth angle θ5 therebetween. The sixth portion 78 is extended from the fifth portion 76 to form a sixth angle θ6 therebetween. The fourth supporting part 54 of the second supporting frame 44 has a seventh portion 80 and an eighth portion 82. The seventh portion 80 is extended from a second end of the second side wall 66 to form a seventh angle θ7 therebetween. The eighth portion 82 is extended from the seventh portion 80 to form an eighth angle θ8 therebetween. In other words, each of portions of the supporting part 46, 48, 52, 54 is bent a predetermined angle without being folded to lean against an adjacent portion of the same supporting part.

In a preferred embodiment, the third angle θ3 is substantially equal to the first angle θ1, the fourth angle θ4 is substantially equal to the second angle θ2, the seventh angle θ7 is substantially equal to the fifth angle θ5, and the eighth angle θ8 is substantially equal to the sixth angle θ6. Each of the angles θ1~θ8 is approximately 90 degrees. On the other hand, at least one of the angles θ1~θ8 can be arranged as a non-vertical angle, such as an obtuse angle or an acute angle, which is illustrated in the following embodiments.

Figure 5:
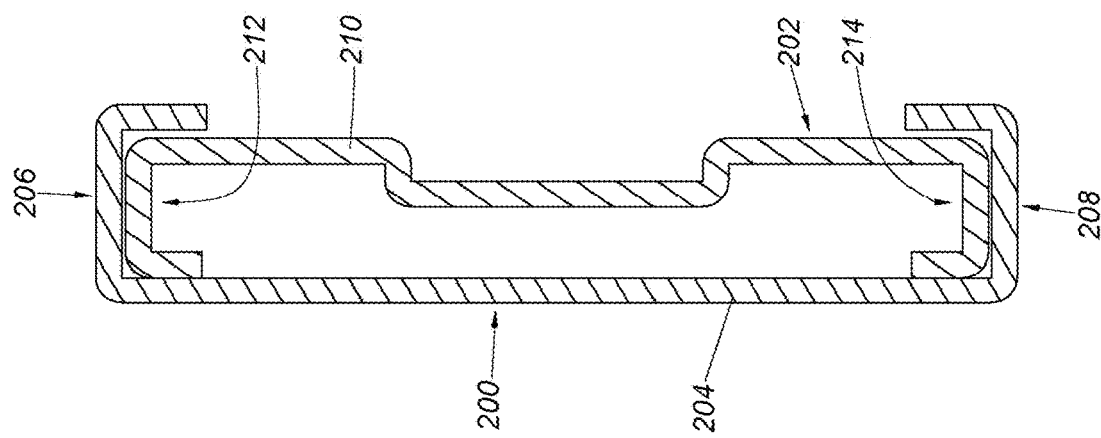
FIG. 5 is a diagram showing supporting arrangement between a first supporting frame and a second supporting frame according to a second embodiment of the present invention.

FIG. 5 is a diagram showing supporting arrangement between a first supporting frame 200 and a second supporting frame 202 according to a second embodiment of the present invention. Arrangement of the first supporting frame 200 is identical to arrangement of the first supporting frame 42 in the first embodiment. The first supporting frame 200 has a first supporting means comprising a first supporting part 206, a second supporting part 208 and a first side wall 204 extendedly connected to the first supporting part 206 and the second supporting part 208. The second supporting frame 202 has a second supporting means comprising a third supporting part 212, a fourth supporting part 214 and a second side wall 210 extendedly connected to the third supporting part 212 and the fourth supporting part 214. The first supporting part 206 of the first supporting frame 200 is configured to support the third supporting part 212 and an upper wall portion of the second side wall 210 of the second supporting frame 202. The second supporting part 208 of the first supporting frame 200 is configured to support the fourth supporting part 214 and a lower wall portion of the second side wall 210 of the second supporting frame 202. The first side wall 204 of the first supporting frame 200 is configured to support the third supporting part 212 and the fourth supporting part 214 of the second supporting frame 202.

Figure 6:
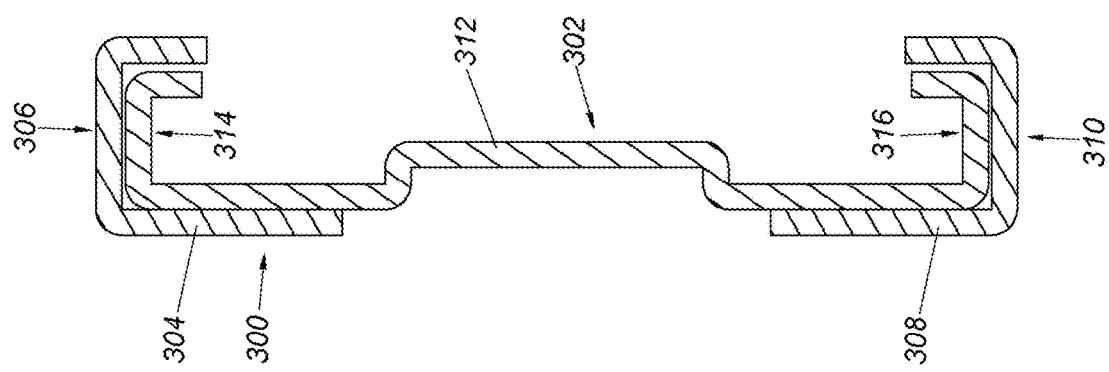
FIG. 6 is a diagram showing supporting arrangement between the first supporting frame and the second supporting frame according to a third embodiment of the present invention.

FIG. 6 is a diagram showing supporting arrangement between a first supporting frame 300 and a second supporting frame 302 according to a third embodiment of the present invention. The first supporting frame 300 has a first supporting means comprising a first supporting part 306, a second supporting part 310, a first upper wall 304 extendedly connected to the first supporting part 306 and a first lower wall 308 extendedly connected to the second supporting part 310. The second supporting frame 302 has a second supporting means comprising a third supporting part 314, a fourth supporting part 316 and a second side wall 312 extendedly connected to the third supporting part 314 and the fourth supporting part 316. The first upper wall 304 and the first lower wall 308 of the first supporting frame 300 are configured to support the second side wall 312 of the second supporting frame 302.

Figure 7:
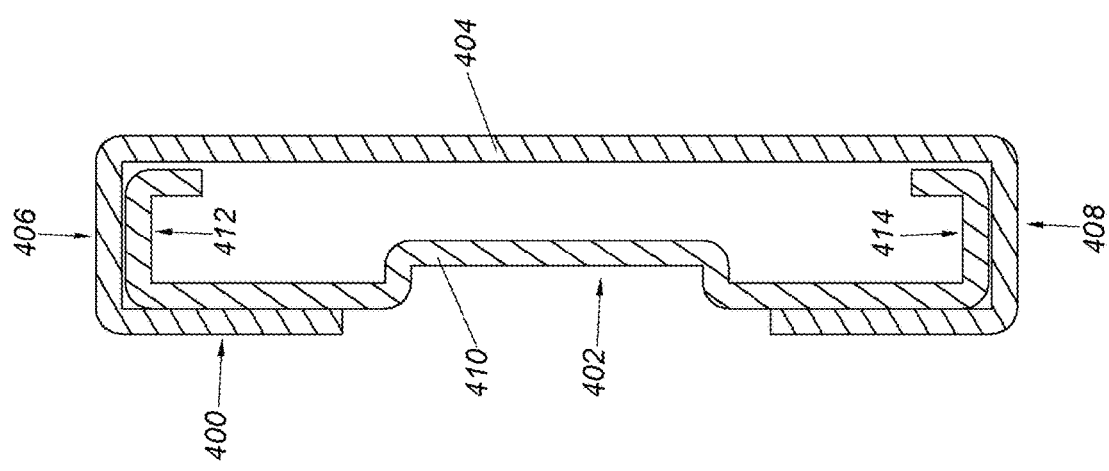
FIG. 7 is a diagram showing supporting arrangement between the first supporting frame and the second supporting frame according to a fourth embodiment of the present invention.

FIG. 7 is a diagram showing supporting arrangement between a first supporting frame 400 and a second supporting frame 402 according to a fourth embodiment of the present invention. The first supporting frame 400 has a first supporting means comprising a first supporting part 406, a second supporting part 408 and a first side wall 404 extendedly connected to the first supporting part 406 and the second supporting part 408. The second supporting frame 402 has a second supporting means comprising a third supporting part 412, a fourth supporting part 414 and a second side wall 410 extendedly connected to the third supporting part 412 and the fourth supporting part 414. The first side wall 404 of the first supporting frame 400 is configured to support the third supporting part 412 and the fourth supporting part 414 of the second supporting frame 402. The first supporting part 406 of the first supporting frame 400 is configured to support an upper wall portion of the second side wall 410 of the second supporting frame 402. The second supporting part 408 of the first supporting frame 400 is configured to support a lower wall portion of the second side wall 410 of the second supporting frame 402.

Figure 8:
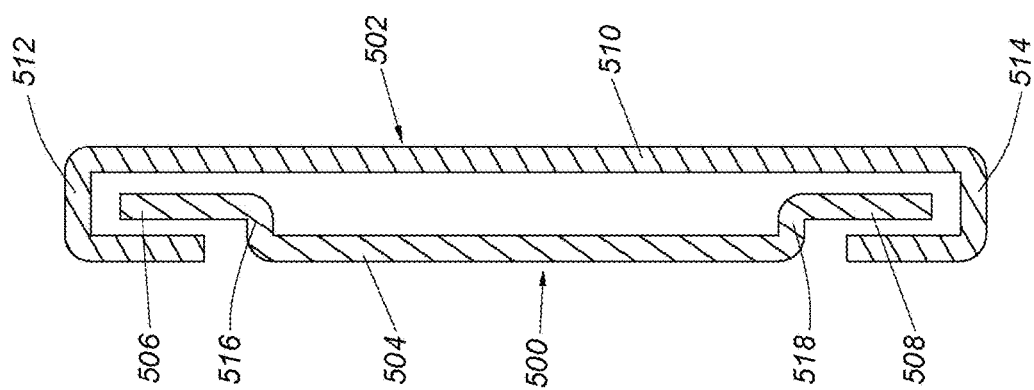
FIG. 8 is a diagram showing supporting arrangement between the first supporting frame and the second supporting frame according to a fifth embodiment of the present invention.

FIG. 8 is a diagram showing supporting arrangement between a first supporting frame 500 and a second supporting frame 502 according to a fifth embodiment of the present invention. The first supporting frame 500 has a first supporting means comprising a first supporting part 506, a second supporting part 508 and a first side wall 504 extendedly connected to the first supporting part 506, and the second supporting part 508. The second supporting frame 502 has a second supporting means comprising a third supporting part 512, a fourth supporting part 514, and a second side wall 510 extendedly connected to the third supporting part 512 and the fourth supporting part 514. The first side wall 504 has a first bending section 516 and a second bending section 518. The first bending section 516 of the first supporting frame 500 is configured to support the third supporting part 512 of the second supporting frame 502. The second bending section 518 of the first supporting frame 500 is configured to support the fourth supporting part 514 of the second supporting frame 502. The first supporting part 506 of the first supporting frame 500 is configured to support the third supporting part 512 and the second side wall 510 of the second supporting frame 502. The second supporting part 508 of the first supporting frame 500 is configured to support the fourth supporting part 514 and the second side wall 510 of the second supporting frame 502.

Figure 9:
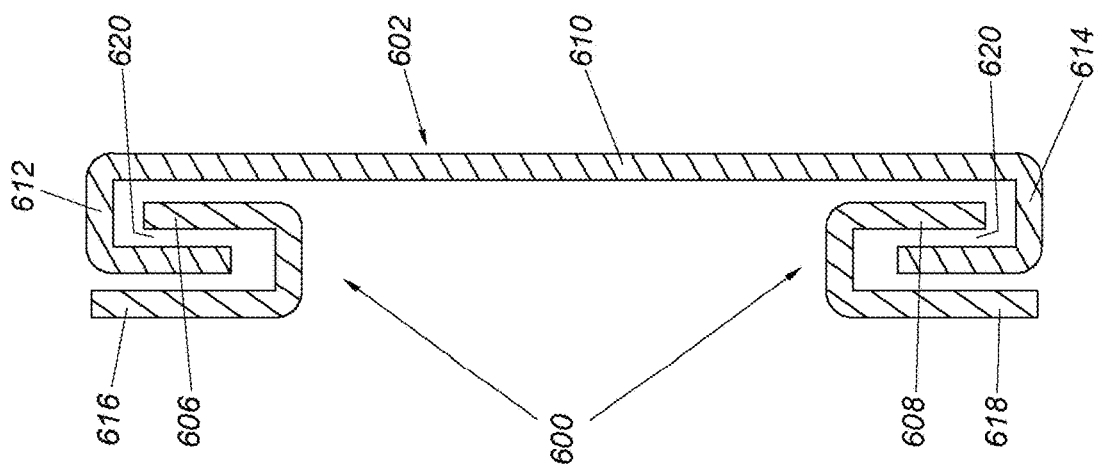
FIG. 9 is a diagram showing supporting arrangement between the first supporting frame and the second supporting frame according to a sixth embodiment of the present invention.

FIG. 9 is a diagram showing supporting arrangement between a first supporting frame 600 and a second supporting frame 602 according to a sixth embodiment of the present invention. The first supporting frame 600 has a first supporting means comprising a first supporting part 606 and a second supporting part 608. The second supporting frame 602 has a second supporting means comprising a third supporting part 612, a fourth supporting part 614 and a second side wall 610 extendedly connected to the third supporting part 612 and the fourth supporting part 614. The first supporting part 606 of the first supporting frame 600 is configured to support the third supporting part 612 and the second side wall 610 of the second supporting frame 602. The second supporting part 608 of the first supporting frame 600 is configured to support the fourth supporting part 614 and the second side wall 610 of the second supporting frame 602. In the present embodiment, the first supporting means further comprises a fifth supporting part 616 and a sixth supporting part 618. The fifth supporting part 616 is extended from the first supporting part 606 of the first supporting frame 600 and is located outside a supporting passage 620 of the first supporting frame 600 for supporting the third supporting part 612 of the second supporting frame 602. The sixth supporting part 618 is extended from the second supporting part 608 of the first supporting frame 600 and is located outside the supporting passage 620 of the first supporting frame 600 for supporting the fourth supporting part 614 of the second supporting frame 602.

Figure 10:
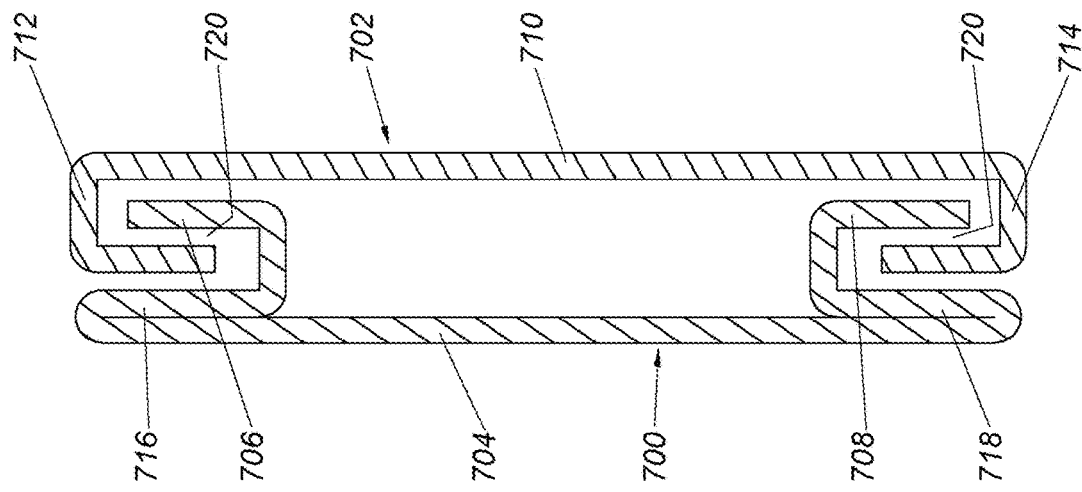
FIG. 10 is a diagram showing supporting arrangement between the first supporting frame and the second supporting frame according to a seventh embodiment of the present invention.

FIG. 10 is a diagram showing supporting arrangement between a first supporting frame 700 and a second supporting frame 702 according to a seventh embodiment of the present invention. The first supporting frame 700 has a first supporting means comprising a first supporting part 706 and a second supporting part 708. The second supporting frame 702 has a second supporting means comprising a third supporting part 712, a fourth supporting part 714 and a second side wall 710 extendedly connected to the third supporting part 712 and the fourth supporting part 714. The first supporting part 706 of the first supporting frame 700 is configured to support the third supporting part 712 and the second side wall 710 of the second supporting frame 702. The second supporting part 708 of the first supporting frame 700 is configured to support the fourth supporting part 714 and the second side wall 710 of the second supporting frame 702. In the present embodiment, the first supporting means further comprises a fifth supporting part 716, a sixth supporting part 718 and a first side wall 704 extendedly connected to the fifth supporting part 716 and the sixth supporting part 718. The fifth supporting part 716 is extended from the first supporting part 706 of the first supporting frame 700 and located outside a supporting passage 720 of the first supporting frame 700 for supporting the third supporting part 712 of the second supporting frame 702. The sixth supporting part 718 is extended from the second supporting part 708 of the first supporting frame 700 and located outside the supporting passage 720 of the first supporting frame 700 for supporting the fourth supporting part 714 of the second supporting frame 702.

Figure 11:
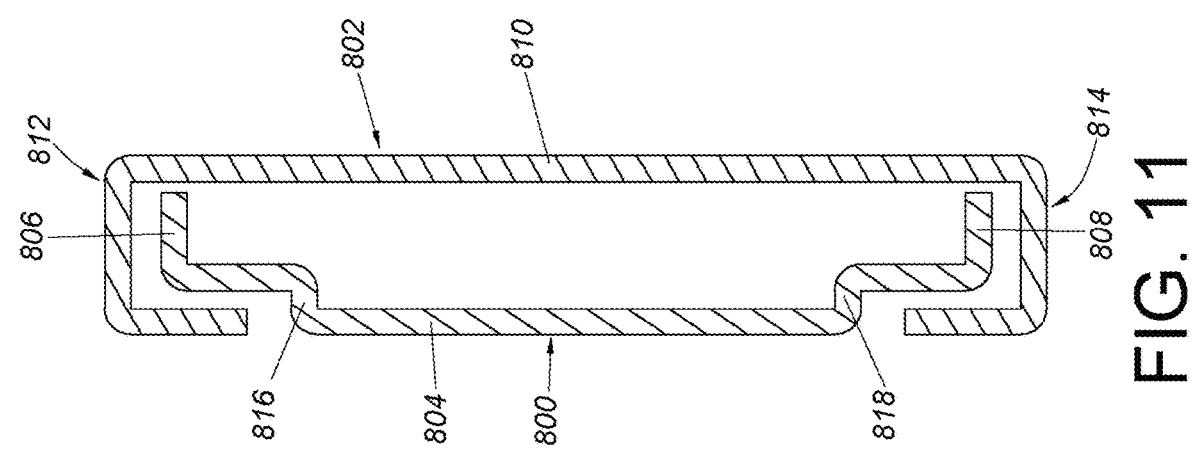
FIG. 11 is a diagram showing supporting arrangement between the first supporting frame and the second supporting frame according to an eighth embodiment of the present invention.

FIG. 11 is a diagram showing supporting arrangement between a first supporting frame 800 and a second supporting frame 802 according to an eighth embodiment of the present invention. The first supporting frame 800 has a first supporting means comprising a first supporting part 806, a second supporting part 808 and a first side wall 804 extendedly connected to the first supporting part 806 and the second supporting part 808. The second supporting frame 802 has a second supporting means comprising a third supporting part 812, a fourth supporting part 814 and a second side wall 810 extendedly connected to the third supporting part 812 and the fourth supporting part 814. The first side wall 804 has a first bending section 816 and a second bending section 818. The first bending section 816 of the first supporting frame 800 is configured to support the third supporting part 812 of the second supporting frame 802. The second bending section 818 of the first supporting frame 800 is configured to support the fourth supporting part 814 of the second supporting frame 802. The first supporting part 806 of the first supporting frame 800 is configured to support the third supporting part 812 and the second side wall 810 of the second supporting frame 802. The second supporting part 808 of the first supporting frame 800 is configured to support the fourth supporting part 814 and the second side wall 810 of the second supporting frame 802.

Figure 12:
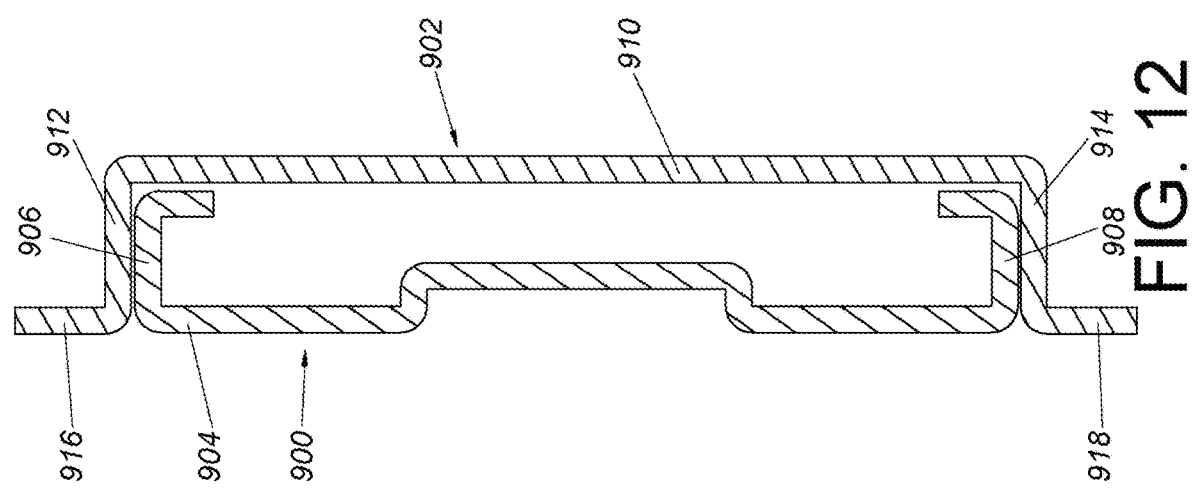
FIG. 12 is a diagram showing supporting arrangement between the first supporting frame and the second supporting frame according to a ninth embodiment of the present invention.

FIG. 12 is a diagram showing supporting arrangement between a first supporting frame 900 and a second supporting frame 902 according to a ninth embodiment of the present invention. The first supporting frame 900 has a first supporting means comprising a first supporting part 906, a second supporting part 908 and a first side wall 904 extendedly connected to the first supporting part 906 and the second supporting part 908. The second supporting frame 902 has a second supporting means comprising a third supporting part 912, a fourth supporting part 914 and a second side wall 910 extendedly connected to the third supporting part 912 and the fourth supporting part 914. The first supporting part 906 of the first supporting frame 900 is configured to support the third supporting part 912 and an upper wall portion of the second side wall 910 of the second supporting frame 902. The second supporting part 908 of the first supporting frame 900 is configured to support the fourth supporting part 914 and a lower wall portion of the second side wall 910 of the second supporting frame 902. Each of the third supporting part 912 and the fourth supporting part 914 of the second supporting frame 902 has an end formed with a bending section 916, 918 extended away from the first side wall 904 of the first supporting frame 900.

Figure 13:
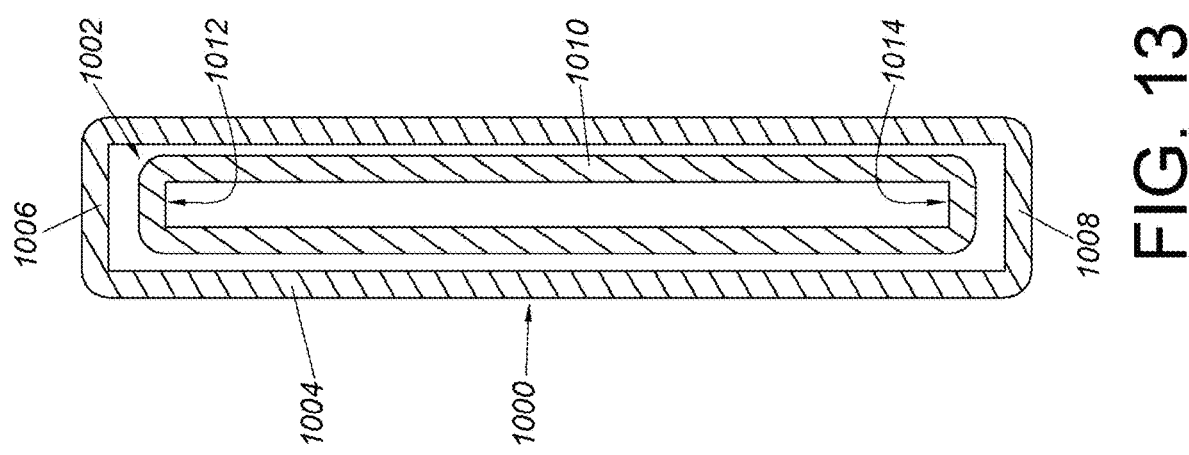
FIG. 13 is a diagram showing supporting arrangement between the first supporting frame and the second supporting frame according to a tenth embodiment of the present invention.

FIG. 13 is a diagram showing supporting arrangement between a first supporting frame 1000 and a second supporting frame 1002 according to a tenth embodiment of the present invention. The first supporting frame 1000 has a first supporting means comprising a first supporting part 1006, a second supporting part 1008 and a first side wall 1004 extendedly connected to two ends of the first supporting part 1006 and two ends of the second supporting part 1008 in order to form a first closed supporting structure (such as a rectangular closed supporting structure). The second supporting frame 1002 has a second supporting means comprising a third supporting part 1012, a fourth supporting part 1014 and a second side wall 1010 extendedly connected to two ends of the third supporting part 1012 and two ends of the fourth supporting part 1014 in order to form a second closed supporting structure. The first closed supporting structure and the second closed supporting structure are configured to support each other.

Figure 14:
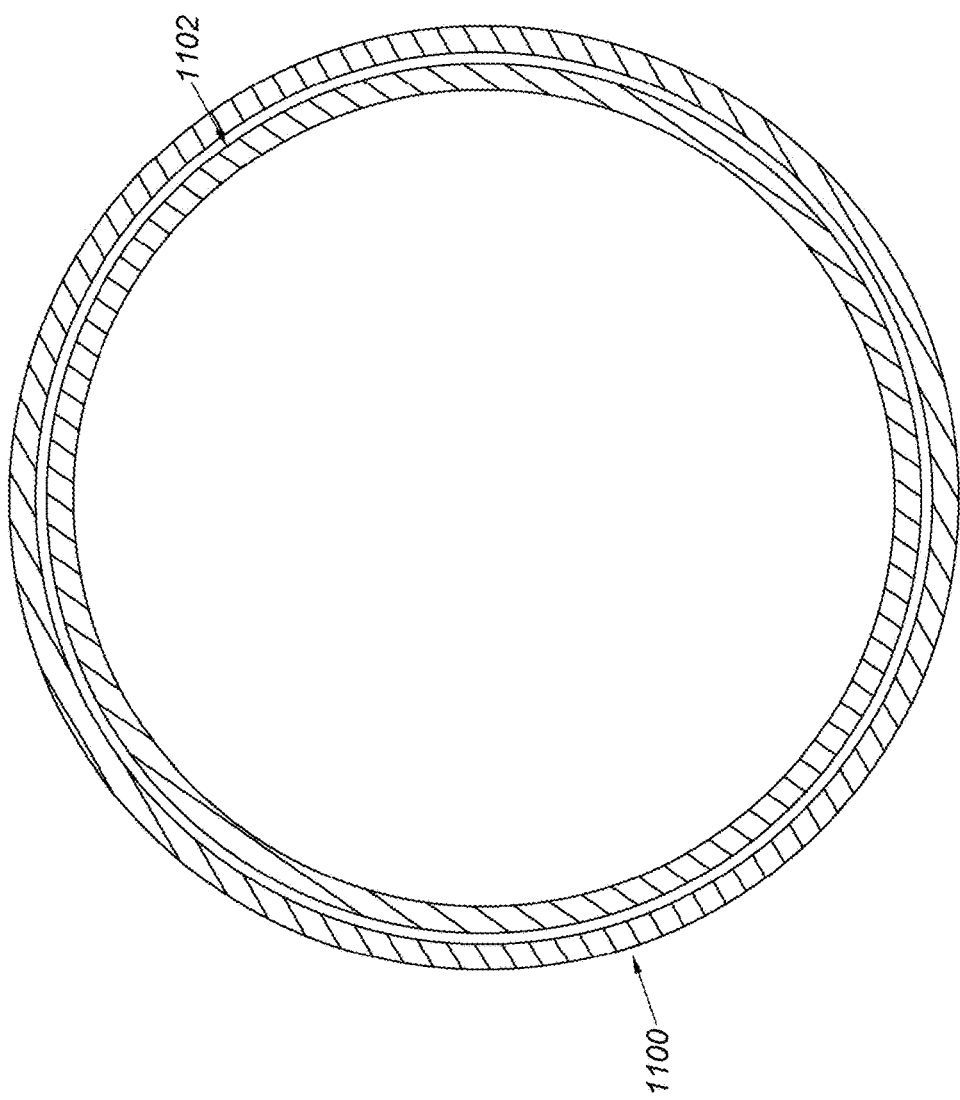
FIG. 14 is a diagram showing supporting arrangement between the first supporting frame and the second supporting frame according to an eleventh embodiment of the present invention.

FIG. 14 is a diagram showing supporting arrangement between a first supporting frame 1100 and a second supporting frame 1102 according to an eleventh embodiment of the present invention. Arrangement of the present embodiment is similar to that of the tenth embodiment shown in FIG. 13. The first supporting frame 1100 forms a first closed supporting structure (such as a circular closed supporting structure). The second supporting frame 1102 forms a second closed supporting structure. The first closed supporting structure and the second closed supporting structure are configured to support each other.

Figure 15:
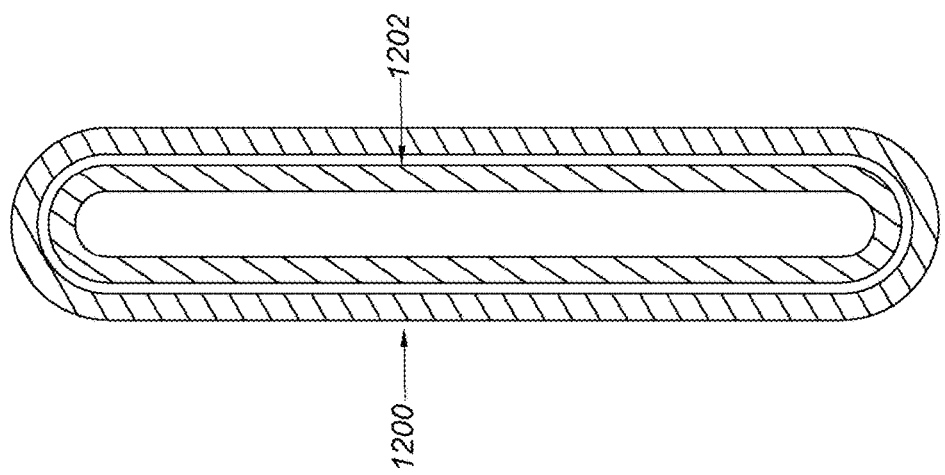
FIG. 15 is a diagram showing supporting arrangement between the first supporting frame and the second supporting frame according to a twelfth embodiment of the present invention.

FIG. 15 is a diagram showing supporting arrangement between a first supporting frame 1200 and a second supporting frame 1202 according to a twelfth embodiment of the present invention. Arrangement of the present embodiment is similar to that of the tenth embodiment shown in FIG. 13. The first supporting frame 1200 forms a first closed supporting structure (such as a closed supporting structure having curved contours at two corresponding ends). The second supporting frame 1202 forms a second closed supporting structure. The first closed supporting structure and the second closed supporting structure are configured to support each other.

Figure 16:
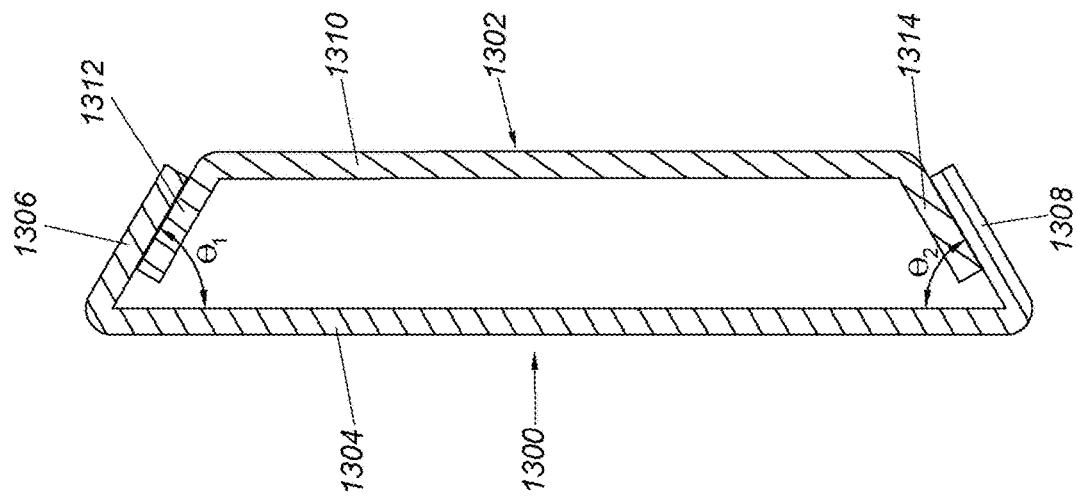
FIG. 16 is a diagram showing supporting arrangement between the first supporting frame and the second supporting frame according to a thirteenth embodiment of the present invention.

FIG. 16 is a diagram showing supporting arrangement between a first supporting frame 1300 and a second supporting frame 1302 according to a thirteenth embodiment of the present invention. The first supporting frame 1300 has a first supporting means comprising a first supporting part 1306, a second supporting part 1308 and a first side wall 1304 extendedly connected to the first supporting part 1306 and the second supporting part 1308. The second supporting frame 1302 has a second supporting means comprising a third supporting part 1312, a fourth supporting part 1314 and a second side wall 1310 extendedly connected to the third supporting part 1312 and the fourth supporting part 1314. The first supporting part 1306 of the first supporting frame 1300 is configured to support the third supporting part 1312 of the second supporting frame 1302. The second supporting part 1308 of the first supporting frame 1300 is configured to support the fourth supporting part 1314 of the second supporting frame 1302. The first supporting part 1306 is extended from a first end of the first side wall 1304 to form a first angle $\theta 1$ therebetween. The second supporting part 1308 is extended from a second end of the first side wall 1304 to form a second angle θ2 therebetween. The first angle θ1 is substantially equal to the second angle θ2 and arranged as an acute angle. The first side wall 1304 of the first supporting frame 1300 and the second side wall 1310 of the second supporting frame 1302 do not directly contact and support each other.

Figure 17:
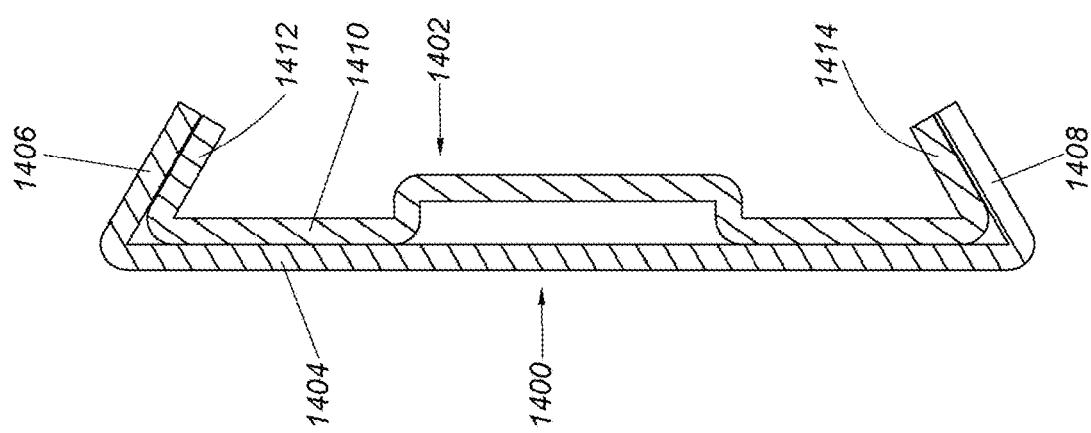
FIG. 17 is a diagram showing supporting arrangement between the first supporting frame and the second supporting frame according to a fourteenth embodiment of the present invention.

FIG. 17 is a diagram showing supporting arrangement between a first supporting frame 1400 and a second supporting frame 1402 according to a fourteenth embodiment of the present invention. The first supporting frame 1400 has a first supporting means comprising a first supporting part 1406, a second supporting part 1408 and a first side wall 1404 extendedly connected to the first supporting part 1406 and the second supporting part 1408. The second supporting frame 1402 has a second supporting means comprising a third supporting part 1412, a fourth supporting part 1414 and a second side wall 1410 extendedly connected to the third supporting part 1412 and the fourth supporting part 1414. The first supporting part 1406 of the first supporting frame 1400 is configured to support the third supporting part 1412 of the second supporting frame 1402. The second supporting part 1408 of the first supporting frame 1400 is configured to support the fourth supporting part 1414 of the second supporting frame 1402. In addition, the first side wall 1404 of the first supporting frame 1400 is configured to support the second side wall 1410 of the second supporting frame 1402.

Figure 18:
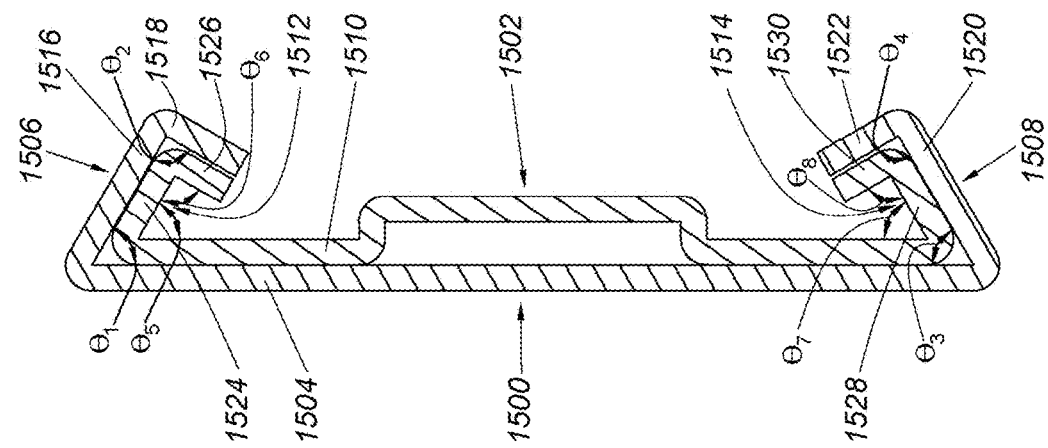
FIG. 18 is a diagram showing supporting arrangement between the first supporting frame and the second supporting frame according to a fifteenth embodiment of the present invention.

FIG. 18 is a diagram showing supporting arrangement between a first supporting frame 1500 and a second supporting frame 1502 according to a fifteenth embodiment of the present invention. The first supporting frame 1500 has a first supporting means comprising a first supporting part 1506, a second supporting part 1508 and a first side wall 1504 extendedly connected to the first supporting part 1506 and the second supporting part 1508. The second supporting frame 1502 has a second supporting means comprising a third supporting part 1512, a fourth supporting part 1514 and a second side wall 1510 extendedly connected to the third supporting part 1512 and the fourth supporting part 1514. The first supporting part 1506 of the first supporting frame 1500 is configured to support the third supporting part 1512 of the second supporting frame 1502. The second supporting part 1508 of the first supporting frame 1500 is configured to support the fourth supporting part 1514 of the second supporting frame 1502. In addition, the first side wall 1504 of the first supporting frame 1500 is configured to support the second side wall 1510 of the second supporting frame 1502. The first supporting part 1506 of the first supporting frame 1500 has a first portion 1516 and a second portion 1518. The first portion 1516 is extended from a first end of the first side wall 1504 to form a first angle θ1 therebetween. The second portion 1518 is extended from the first portion 1516 to form a second angle θ2 therebetween. The second supporting part 1508 of the first supporting frame 1500 has a third portion 1520 and a fourth portion 1522. The third portion 1520 is extended from a second end of the first side wall 1504 to form a third angle θ3 therebetween. The fourth portion 1522 is extended from the third portion 1520 to form a fourth angle θ4 therebetween. The third supporting part 1512 of the second supporting frame 1502 has a fifth portion 1524 and a sixth portion 1526. The fifth portion 1524 is extended from a first end of the second side wall 1510 to form a fifth angle θ5 therebetween. The sixth portion 1526 is extended from the fifth portion 1524 to form a sixth angle θ6 therebetween. The fourth supporting part 1514 of the second supporting frame 1502 has a seventh portion 1528 and an eighth portion 1530. The seventh portion 1528 is extended from a second end of the second side wall 1510 to form a seventh angle θ7 therebetween. The eighth portion 1530 is extended from the seventh portion 1528 to form an eighth angle θ8 therebetween. Preferably, the third angle θ3 is substantially equal to the first angle θ1, and the seventh angle θ7 is substantially equal to the fifth angle θ5. Each of the first, the third, the fifth, and the seventh angles θ1, θ3, θ5, θ7 is arranged as an acute angle. The fourth angle θ4 is substantially equal to the second angle θ2. The eighth angle θ8 is substantially equal to the sixth angle θ6. Each of the second, the fourth, the sixth, and the eighth angles θ2, θ4, θ6, θ8 is approximately 90 degrees.

Figure 19:
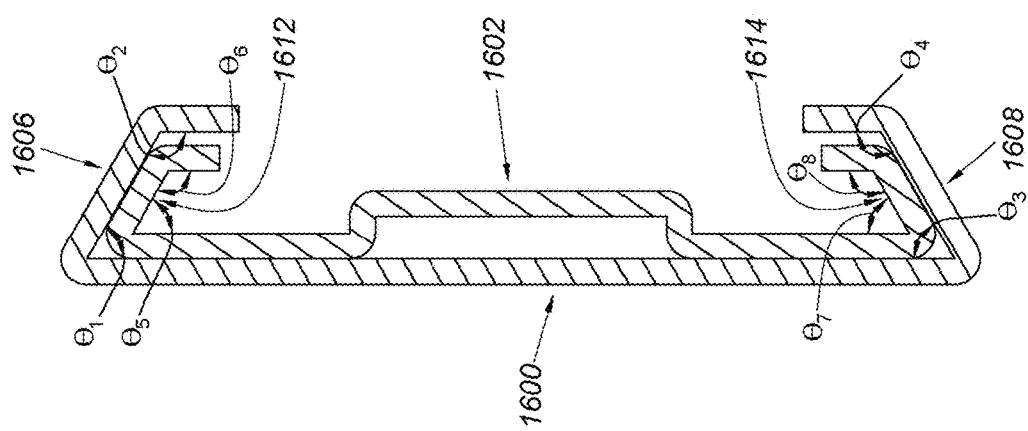
FIG. 19 is a diagram showing supporting arrangement between the first supporting frame and the second supporting frame according to a sixteenth embodiment of the present invention.

FIG. 19 is a diagram showing supporting arrangement between a first supporting frame 1600 and a second supporting frame 1602 according to a sixteenth embodiment of the present invention. Arrangement of the present embodiment is similar to that of the fifteenth embodiment shown in FIG. 18. Bending angles of a first supporting part 1606 and a second supporting part 1608 of the first supporting frame 1600 and bending angles of a third supporting part 1612 and a fourth supporting part 1614 of the second supporting frame 1602 of the present embodiment are different from those of the fifteenth embodiment. In particular, each of the second, the fourth, the sixth, and the eighth angles θ2, θ4, θ6, θ8 is arranged as an obtuse angle.

Figure 20:
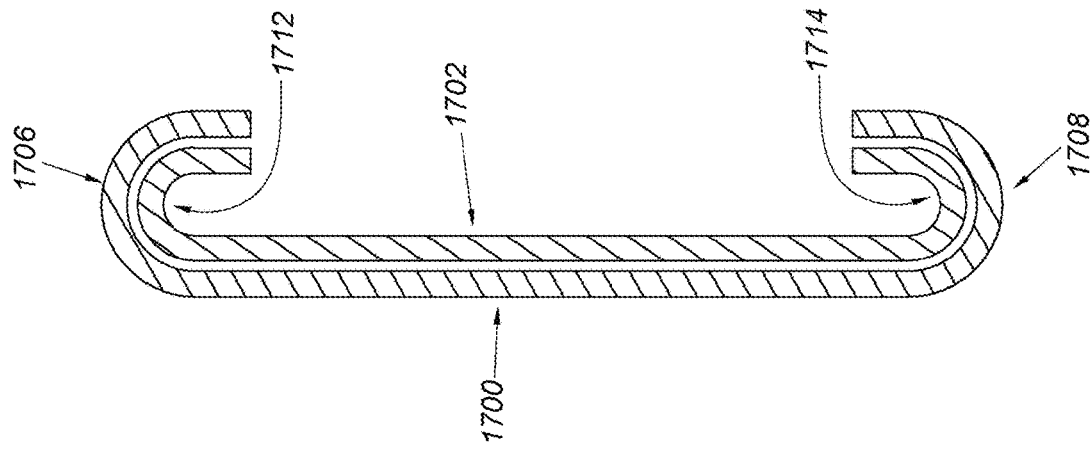
FIG. 20 is a diagram showing supporting arrangement between the first supporting frame and the second supporting frame according to a seventeenth embodiment of the present invention.

FIG. 20 is a diagram showing supporting arrangement between a first supporting frame 1700 and a second supporting frame 1702 according to a seventeenth embodiment of the present invention. Arrangement of the present embodiment is similar to that of the fifteenth embodiment shown in FIG. 18. A main difference between the two embodiments is that a first supporting part 1706 and a second supporting part 1708 of the first supporting frame 1700 have curved supporting contours respectively corresponding to and contacting with curved supporting contours of a third supporting part 1712 and a fourth supporting part 1714 of the second supporting frame 1702.

Figure 21:
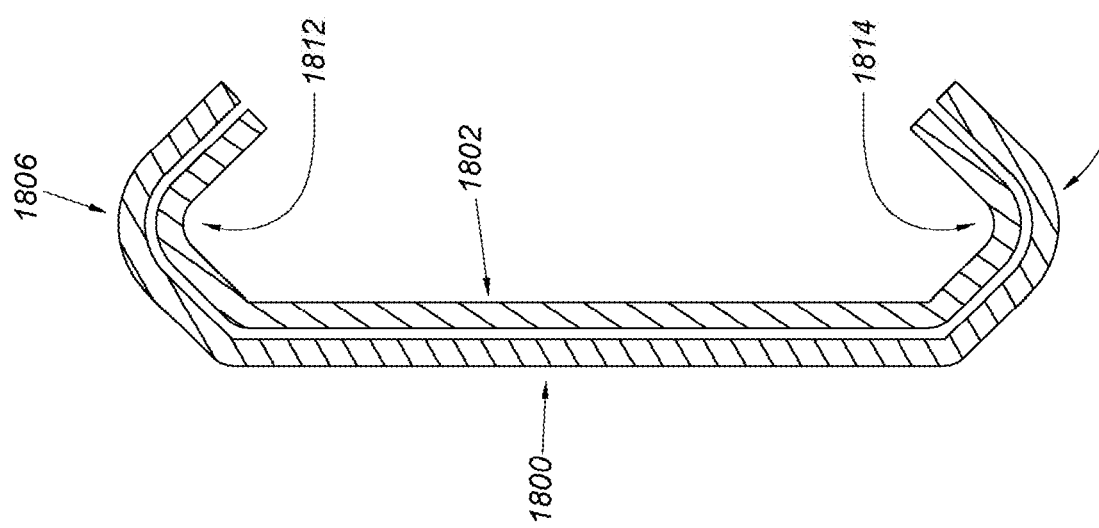
FIG. 21 is a diagram showing supporting arrangement between the first supporting frame and the second supporting frame according to an eighteenth embodiment of the present invention.

FIG. 21 is a diagram showing supporting arrangement between a first supporting frame 1800 and a second supporting frame 1802 according to an eighteenth embodiment of the present invention. Arrangement of the present embodiment is similar to that of the seventeenth embodiment shown in FIG. 20. A main difference between the two embodiments is that a first supporting part 1806 and a second supporting part 1808 of the first supporting frame 1800 have another curved supporting contours respectively corresponding to and contacting with another curved supporting contours of a third supporting part 1812 and a fourth supporting part 1814 of the second supporting frame 1802, such that shapes of the first supporting frame 1800 and the second supporting frame 1802 of the present embodiment are different from those of the seventeenth embodiment.

Figure 22:
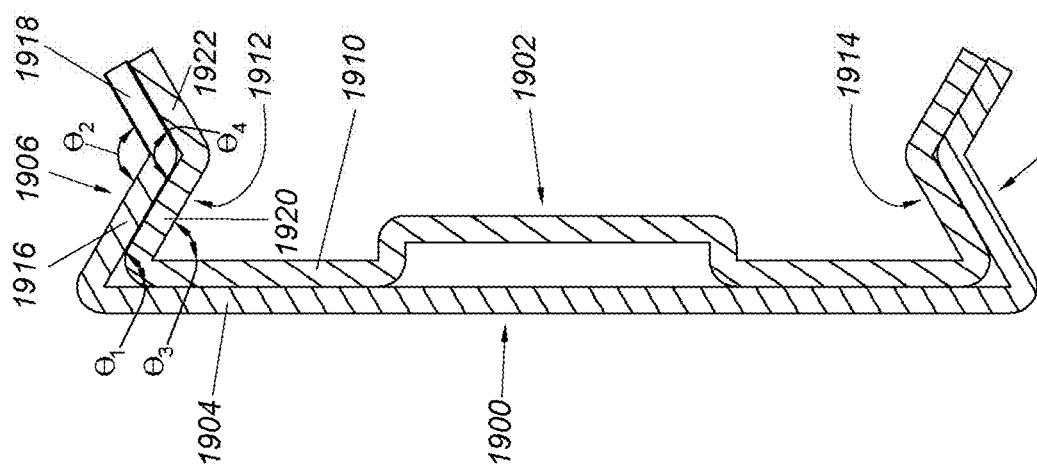
FIG. 22 is a diagram showing supporting arrangement between the first supporting frame and the second supporting frame according to a nineteenth embodiment of the present invention.

FIG. 22 is a diagram showing supporting arrangement between a first supporting frame 1900 and a second supporting frame 1902 according to a nineteenth embodiment of the present invention. The first supporting frame 1900 has a first supporting means comprising a first supporting part 1906 and a second supporting part 1908. The first supporting part 1906 has a first turning section 1916 and a second turning section 1918. The first turning section 1916 is extended from a first end of a first side wall 1904 to form a first angle θ1 therebetween. The second turning section 1918 is extended from the first turning section 1916 to form a second angle θ2 therebetween. The first angle θ1 is arranged as an acute angle and the second angle θ2 is arranged as an obtuse angle. On the other hand, the second supporting frame 1902 has a second supporting means comprising a third supporting part 1912 and a fourth supporting part 1914. The third supporting part 1912 has a third turning section 1920 and a fourth turning section 1922. The third turning section 1920 is extended from a first end of a second side wall 1910 to form a third angle θ3 therebetween. The fourth turning section 1922 is extended from the third turning section 1920 to form a fourth angle θ4 therebetween. The third angle θ3 is arranged as an acute angle and the fourth angle θ4 is arranged as an obtuse angle. Supporting arrangement of the other sides (the second supporting part 1908 and the fourth supporting part 1914) of the first supporting frame 1900 and the second supporting frame 1902 is symmetric to the above arrangement. Therefore, no further illustration is provided.

Figure 23:
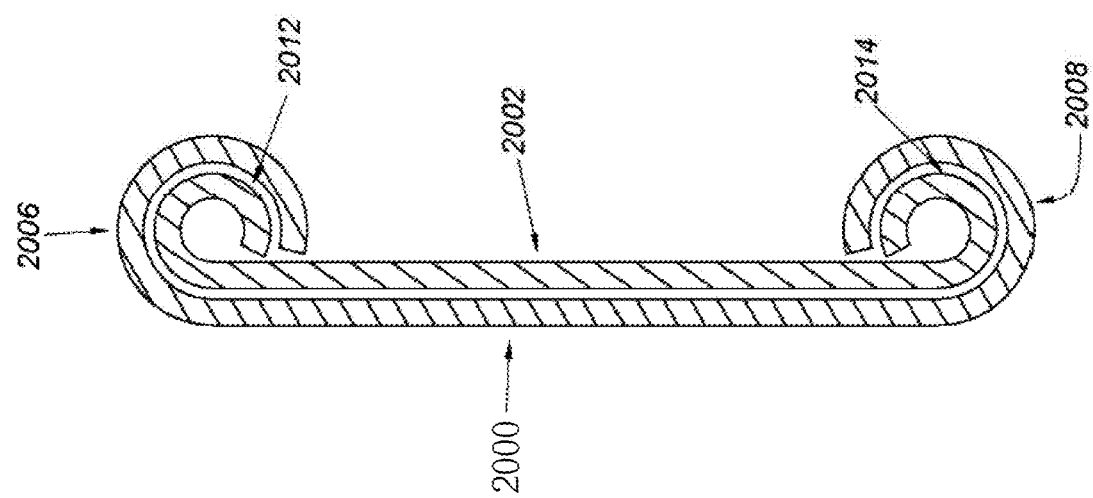
FIG. 23 is a diagram showing supporting arrangement between the first supporting frame and the second supporting frame according to a twentieth embodiment of the present invention.

FIG. 23 is a diagram showing supporting arrangement between a first supporting frame 2000 and a second supporting frame 2002 according to a twentieth embodiment of the present invention. The first supporting frame 2000 has a first supporting means comprising a first supporting part 2006 and a second supporting part 2008. The second supporting frame 2002 has a second supporting means comprising a third supporting part 2012 and a fourth supporting part 2014. The first supporting means of the first supporting frame 2000 have a roll-shaped supporting contour corresponding to and contacting with a roll-shaped supporting contour of the second supporting means of the second supporting frame 2002.

Figure 24:
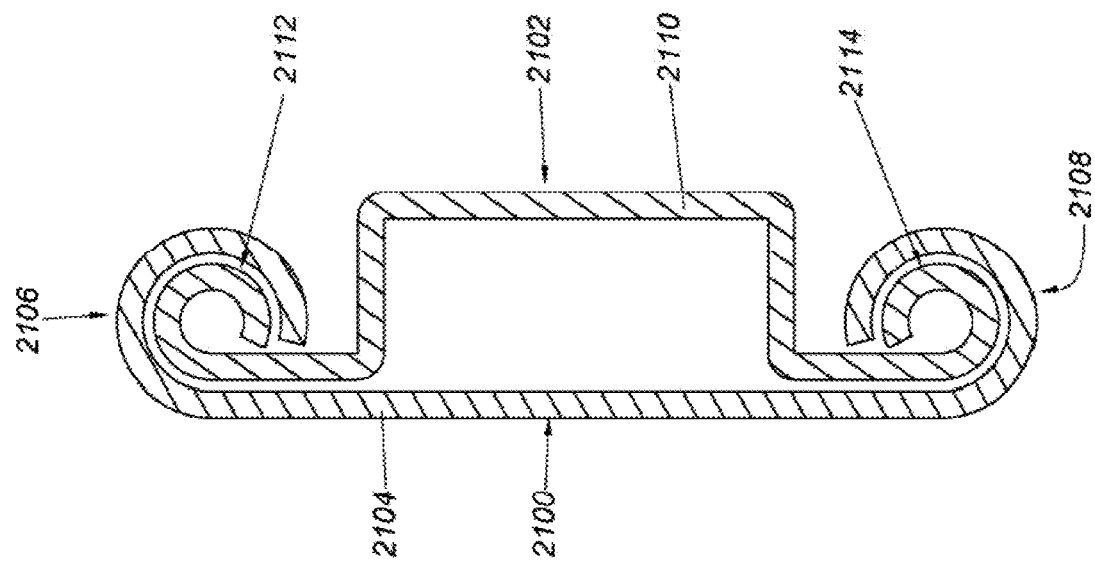
FIG. 24 is a diagram showing supporting arrangement between the first supporting frame and the second supporting frame according to a twenty first embodiment of the present invention.

FIG. 24 is a diagram showing supporting arrangement between a first supporting frame 2100 and a second supporting frame 2102 according to a twenty first embodiment of the present invention. Arrangement of the present embodiment is similar to that of the twentieth embodiment shown in FIG. 23. A first supporting part 2106 and a second supporting part 2108 of the first supporting frame 2100 have roll-shaped supporting contours respectively corresponding to and contacting with roll-shaped supporting contours of a third supporting part 2112 and a fourth supporting part 2114 of the second supporting frame 2108. A main difference between the present embodiment and the twentieth embodiment is that a first side wall 2104 of the first supporting frame 2100 and a second side wall 2110 of the second supporting frame 2102 have portions not configured to support each other.

Figure 25:
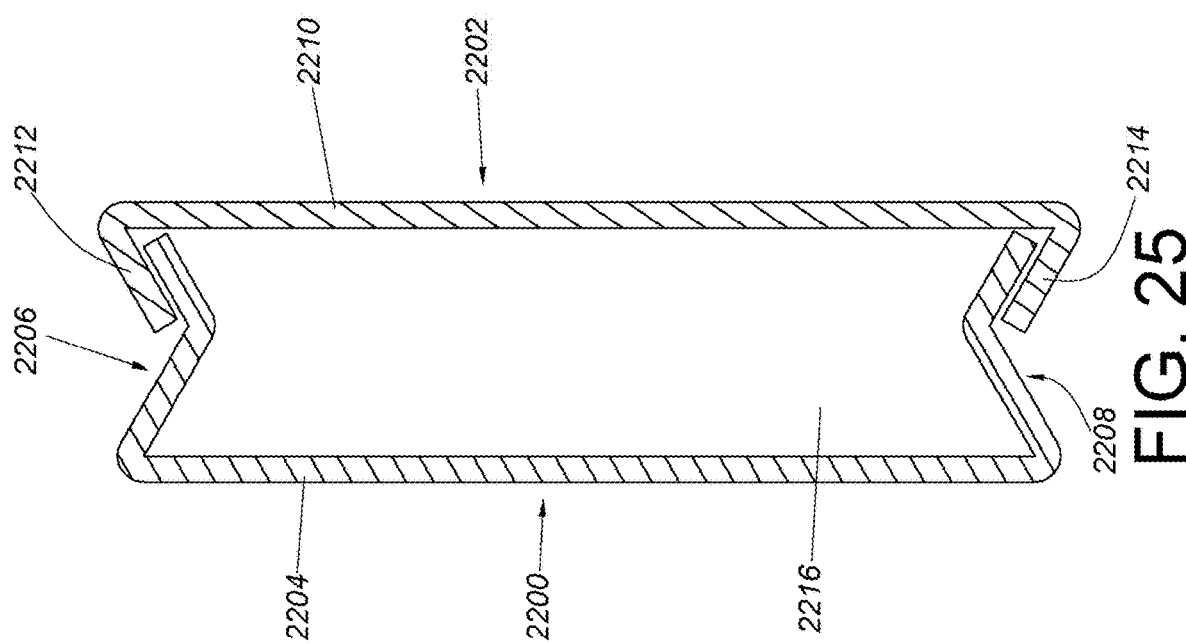
FIG. 25 is a diagram showing supporting arrangement between the first supporting frame and the second supporting frame according to a twenty second embodiment of the present invention.

FIG. 25 is a diagram showing supporting arrangement between a first supporting frame 2200 and a second supporting frame 2202 according to a twenty second embodiment of the present invention. The first supporting frame 2200 has a first supporting means comprising a first supporting part 2206, a second supporting part 2208 and a first side wall 2204 extendedly connected to the first supporting part 2206 and the second supporting part 2208. The second supporting frame 2202 has a second supporting means comprising a third supporting part 2212, a fourth supporting part 2214 and a second side wall 2210 extendedly connected to the third supporting part 2212 and the fourth supporting part 2214. The first supporting part 2206 of the first supporting frame 2200 is configured to support the third supporting part 2212 of the second supporting frame 2202. The second supporting part 2208 of the first supporting frame 2200 is configured to support the fourth supporting part 2214 of the second supporting frame 2202. In the present embodiment, the third supporting part 2212 and the fourth supporting part 2214 of the second supporting frame 2202 are located outside a supporting passage 2216 of the first supporting frame 2200. The third supporting part 2212 of the second supporting frame 2202 and the first supporting part 2206 of the first supporting frame 2200 are configured to support each other; and the fourth supporting part 2214 of the second supporting frame 2202 and the second supporting part 2208 of the first supporting frame 2200 are configured to support each other.

Figure 26:
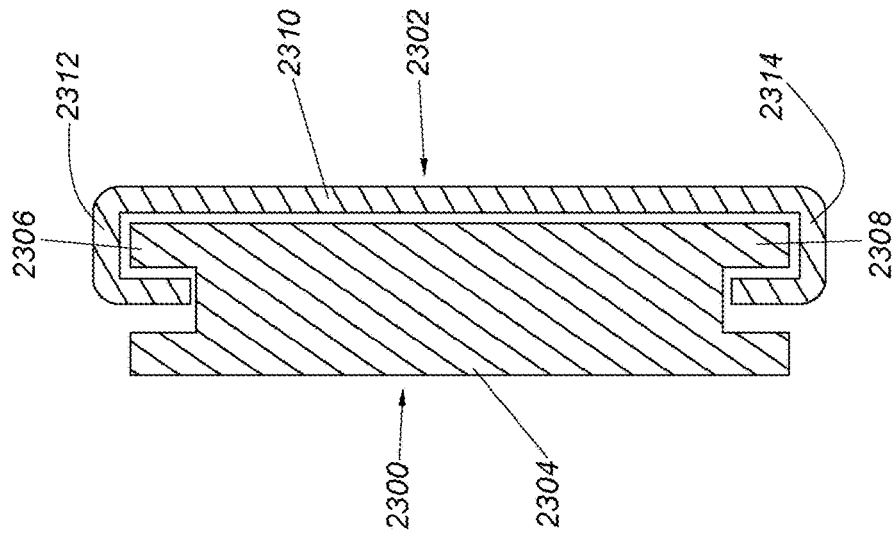
FIG. 26 is a diagram showing supporting arrangement between the first supporting frame and the second supporting frame according to a twenty third embodiment of the present invention.
Figure 27:
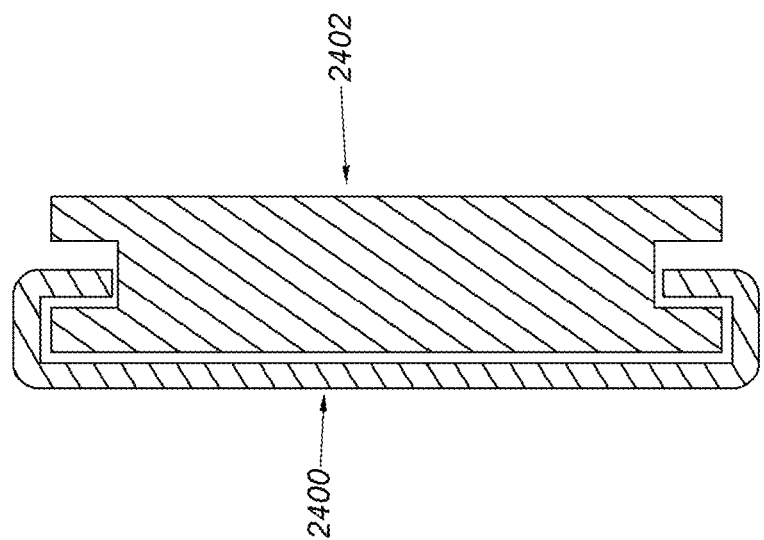
FIG. 27 is a diagram showing supporting arrangement between the first supporting frame and the second supporting frame according to a twenty fourth embodiment of the present invention.

FIG. 26 is a diagram showing supporting arrangement between a first supporting frame 2300 and a second supporting frame 2302 according to a twenty third embodiment of the present invention. The first supporting frame 2300 has a first supporting means comprising a first supporting part 2306, a second supporting part 2308 and a first side wall 2304 extendedly connected to the first supporting part 2306 and the second supporting part 2308. The second supporting frame 2302 has a second supporting means comprising a third supporting part 2312, a fourth supporting part 2314 and a second side wall 2310 extendedly connected to the third supporting part 2312 and the fourth supporting part 2314. The first supporting part 2306 of the first supporting frame 2300 is configured to support the third supporting part 2312 of the second supporting frame 2302. The second supporting part 2308 of the first supporting frame 2300 is configured to support the fourth supporting part 2314 of the second supporting frame 2302. In addition, FIG. 27 is a diagram showing supporting arrangement between a first supporting frame 2400 and a second supporting frame 2402 according to a twenty fourth embodiment of the present invention. Arrangement of the present embodiment is similar to that of the twenty third embodiment. A main difference between the two embodiments is that mounting positions of the two frames are different.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A supporting device for a rail member, comprising:
a first supporting frame having a first supporting means comprising an upper element and a lower element, the upper element comprising a first supporting part, the lower element comprising a second supporting part, a supporting passage being defined by the upper element and the lower element; and
a second supporting frame having a second supporting means comprising a third supporting part and a fourth supporting part, the first supporting means and the second supporting means being configured to support each other;
wherein the rail member comprises a first rail and has a first side and a second side opposite to the first side, the first side of the rail member is formed with a slide rail passage for accommodating the first rail in order to allow the first rail to slide within the slide rail passage of the rail member, the second side of the rail member is configured to be connected to the first supporting frame, the first supporting part of the first supporting frame is configured to support the third supporting part of the second supporting frame, and the second supporting part of the first supporting frame is configured to support the fourth supporting part of the second supporting frame;
wherein the upper element is spaced from and not directly connected to the lower element, and the upper element and the lower element are formed as two independent parts of the first supporting frame;

wherein the upper element and the lower element of the first supporting means have an identical shape and are disposed on the second side of the rail member.

2. The supporting device of claim 1, wherein the upper element further comprises a first upper wall extendedly connected to the first supporting part, the lower element further comprises a first lower wall extendedly connected to the second supporting part, the second supporting frame further comprises a second side wall extendedly connected to the third supporting part and the fourth supporting part, the first upper wall and the first lower wall of the first supporting frame are configured to support the second side wall of the second supporting frame.

3. The supporting device of claim 2, wherein a sum of a length of the first upper wall and a length of the first lower wall along a direction perpendicular to an extending direction of the rail member is less than a length of a second side wall of the second supporting frame along the direction perpendicular to the extending direction of the rail member.

4. The supporting device of claim 1, wherein the first supporting frame is fixed on the second side of the rail member.

5. The supporting device of claim 1, wherein the upper element and the lower element of the first supporting means are symmetrically disposed on the second side of the rail member.

6. The supporting device of claim 1, wherein when the supporting device is mounted between a first post and a second post of a rack, the first post and the second post of the rack are located at the second side of the rail member.

7. A supporting device for a rail member, comprising:
   a first supporting frame having a first supporting means comprising an upper element and a lower element, the upper element comprising a first supporting part, the lower element comprising a second supporting part, a supporting passage being defined by the upper element and the lower element; and
   a second supporting frame having a second supporting means comprising a third supporting part and a fourth supporting part, the first supporting means and the second supporting means being configured to support each other;
   wherein the first supporting frame is fixed on an outer surface of the rail member, the first supporting part of the first supporting frame is configured to support the third supporting part of the second supporting frame, and the second supporting part of the first supporting frame is configured to support the fourth supporting part of the second supporting frame;
   wherein the upper element is spaced from and not directly connected to the lower element, and the upper element and the lower element are formed as two independent parts of the first supporting frame;
   wherein the upper element and the lower element have an identical shape and are symmetrically disposed on the outer surface of the rail member.

* * * * *